US012795820B2

(12) United States Patent
Feng et al.

(10) Patent No.: US 12,795,820 B2
(45) Date of Patent: Nov. 10, 2026

(54) CHIP ON FILM COMPRISING DIELECTRIC STRIPS BETWEEN CONNECTING WIRES AND DISPLAY DEVICE INCLUDING THE SAME

(71) Applicants: Beijing BOE Display Technology Co., Ltd., Beijing (CN); BOE Technology Group Co., Ltd., Beijing (CN)

(72) Inventors: Bo Feng, Beijing (CN); Weifan Yang, Beijing (CN); Lei Liu, Beijing (CN); Xiaofeng Yin, Beijing (CN)

(73) Assignees: BEIJING BOE DISPLAY TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 364 days.

(21) Appl. No.: 18/578,725

(22) PCT Filed: Apr. 27, 2022

(86) PCT No.: PCT/CN2022/089641
§ 371 (c)(1),
(2) Date: Jan. 12, 2024

(87) PCT Pub. No.: WO2023/206159
PCT Pub. Date: Nov. 2, 2023

(65) Prior Publication Data

US 2024/0387565 A1 Nov. 21, 2024

(51) Int. Cl.
*H05K 1/02* (2006.01)
*G02F 1/1345* (2006.01)
(Continued)

(52) U.S. Cl.
CPC ....... *H05K 1/0296* (2013.01); *G02F 1/13452* (2013.01); *H05K 1/028* (2013.01); *G06F 1/16* (2013.01); *H10K 59/131* (2023.02)

(58) Field of Classification Search
None
See application file for complete search history.

(56) References Cited

U.S. PATENT DOCUMENTS 9,713,249 B2 7/2017 Cheng et al.
2015/0173170 A1 6/2015 Cheng et al.
2022/0087015 A1* 3/2022 Park .................... H05K 1/0296

FOREIGN PATENT DOCUMENTS

CN 101777524 A 7/2010
CN 101777524 B 9/2011
(Continued)

OTHER PUBLICATIONS

International Search Report and Written Opinion mailed on Aug. 2, 2022, in corresponding PCT/CN2022/089641, 6 pages.

*Primary Examiner* — Daniel Whalen
(74) *Attorney, Agent, or Firm* — XSENSUS LLP

(57) ABSTRACT

A chip on film includes: a substrate layer; a conductor layer, arranged at a side of the substrate layer, where the conductor layer includes a plurality of connecting wires arranged along a first direction, and a gap is provided between two adjacent ones of the connecting wires; a plurality of dielectric strips, where the dielectric strip is provided in at least part of gaps, a length of the dielectric strip in a second direction is less than or equal to a length of the gap in the second direction, and the second direction intersects with the first direction; and a protective layer, arranged at a side of the conductor layer and the dielectric strip away from the substrate layer, where the dielectric strip has a larger dielectric constant than the protective layer.

19 Claims, 8 Drawing Sheets

(51) Int. Cl.

| | |
|---|---|
| ***H10K 59/131*** | (2023.01) |
| *G06F 1/16* | (2006.01) |

(56) References Cited

FOREIGN PATENT DOCUMENTS

| | | | |
|---|---|---|---|
| CN | 103269563 | A | 8/2013 |
| CN | 113589893 | A | 11/2021 |

* cited by examiner

CHIP ON FILM COMPRISING DIELECTRIC STRIPS BETWEEN CONNECTING WIRES AND DISPLAY DEVICE INCLUDING THE SAME

CROSS-REFERENCE TO RELATED APPLICATION

The present application is the U.S. National Stage of International Application No. PCT/CN2022/089641, filed on Apr. 27, 2022, the contents of which are incorporated herein by reference in their entireties for all purposes.

TECHNICAL FIELD

The present disclosure relates to the field of display technology, and in particular to a chip on film and a display device.

BACKGROUND

With the development of science and technology, customers have higher and higher requirements for display products, and the refresh rate has been increasing from 120 Hz to even as high as 500/1000 Hz. The increase in the refresh rate has resulted in poor display image quality.

It should be illustrated that the information disclosed in the above background section is only used for enhancing the understanding of the background of the present disclosure, and thus may include information that does not constitute prior art known to those ordinary skilled in the art.

SUMMARY

An object of the present disclosure is to overcome the deficiencies of the prior art described above and provide a chip on film and a display device.

According to an aspect of the present disclosure, a chip on film is provided. The chip on film includes:

- a substrate layer;
- a conductor layer, arranged at a side of the substrate layer, where the conductor layer includes a plurality of connecting wires arranged along a first direction, and a gap is provided between two adjacent ones of the connecting wires;
- a plurality of dielectric strips, where the dielectric strip is provided in at least part of gaps, a length of the dielectric strip in a second direction is less than or equal to a length of the gap in the second direction, and the second direction intersects with the first direction; and
- a protective layer, arranged at a side of the conductor layer and the dielectric strip away from the substrate layer, where the dielectric strip has a larger dielectric constant than the protective layer.

In an exemplary embodiment of the present disclosure, the plurality of the connecting wires are arranged symmetrically relative to a symmetry axis, the plurality of the dielectric strips are arranged symmetrically relative to the symmetry axis, and the symmetry axis is a central axis, extending along the second direction, of the substrate layer.

In an exemplary embodiment of the present disclosure, lengths of the plurality of the dielectric strips in the second direction decrease as distances between the dielectric strips and the symmetry axis increases.

In an exemplary embodiment of the present disclosure, the plurality of the dielectric strips are provided with flush ends.

In an exemplary embodiment of the present disclosure, the dielectric strip has a same height in a third direction as the connecting wire, the third direction is perpendicular to a surface of the substrate layer close to the conductor layer.

The chip on film further includes a dielectric layer arranged between the conductor layer and the protective layer. An orthographic projection of the protective layer on the substrate layer covers and is larger than an orthographic projection of the dielectric layer on the substrate layer. The orthographic projection of the dielectric layer on the substrate layer covers an orthographic projection of the dielectric strip on the substrate layer. The dielectric layer has a larger dielectric constant than the protective layer.

In an exemplary embodiment of the present disclosure, the dielectric layer has the same dielectric constant as the dielectric strip, and the dielectric layer and the plurality of the dielectric strips are connected as an integrated body.

In an exemplary embodiment of the present disclosure, an outermost edge line of an orthographic projection, on the substrate layer, of the plurality of the dielectric strips coincides with an edge line of the orthographic projection, on the substrate layer, of the dielectric layer.

In an exemplary embodiment of the present disclosure, the chip on film further includes:

- an integrated circuit, arranged at a side of the protective layer away from the substrate layer and electrically connected to the conductor layer;
- a first binding pin, arranged at a side of the integrated circuit, and used for connecting to an output signal end; and
- a second binding pin, arranged at a side of the integrated circuit away from the first binding pin, and used for connecting to an input signal end.

In an exemplary embodiment of the present disclosure, the dielectric strip and the dielectric layer are arranged at a side of the integrated circuit close to the first binding pin.

In an exemplary embodiment of the present disclosure, the plurality of the connecting wires are arranged symmetrically relative to a symmetry axis, the dielectric layer is arranged symmetrically relative to the symmetry axis, the plurality of the dielectric strips are arranged symmetrically relative to the symmetry axis, and the symmetry axis is a central axis, extending along the second direction, of the integrated circuit.

In an exemplary embodiment of the present disclosure, a length of the dielectric layer in the second direction decreases as a distance between the dielectric layer and the symmetry axis increases.

In an exemplary embodiment of the present disclosure, ends of the plurality of the dielectric strips close to the integrated circuit are flush, a side surface of the dielectric layer close to the integrated circuit is coplanar with an end surface of the plurality of the dielectric strips close to the integrated circuit, and a side surface of the dielectric layer away from the integrated circuit intersects with the first direction.

In an exemplary embodiment of the present disclosure, the dielectric layer does not cover the connecting wire that is located outermost, and no dielectric strip is provided in the gap between the connecting wire that is located outermost and the connecting wire adjacent to the connecting wire that is located outermost.

In an exemplary embodiment of the present disclosure, two of the connecting wires adjacent to the symmetry axis are completely covered by the dielectric layer, and the length, in the second direction, of the dielectric strip between the two connecting wires adjacent to the symmetry axis is equal to a length of the connecting wire in the second direction; or the connecting wire that is passed through by the symmetry axis is completely covered by the dielectric layer, and lengths, in the second direction, of two of the dielectric strips adjacent to the symmetry axis are equal to the length of the connecting wire in the second direction.

In an exemplary embodiment of the present disclosure, the dielectric constant of the dielectric layer and the dielectric constant of the dielectric strip increase as a minimum target compensation capacitance of the chip on film increases; and/or a length of the dielectric layer in the second direction and the length of the dielectric strip in the second direction increase as the minimum target compensation capacitance of the chip on film increases.

In an exemplary embodiment of the present disclosure, when the minimum target compensation capacitance of the chip on film is larger than or equal to five times an original capacitance, the dielectric constant of the dielectric layer and the dielectric constant of the dielectric strip are larger than or equal to 60, and a sum of a thickness of the dielectric layer and a thickness of the dielectric strip is larger than or equal to 10 microns; or when the minimum target compensation capacitance of the chip on film is larger than or equal to two times the original capacitance, the dielectric constant of the dielectric layer and the dielectric constant of the dielectric strip are larger than or equal to 30, and the sum of the thickness of the dielectric layer and the thickness of the dielectric strip is larger than or equal to 10 microns.

In an exemplary embodiment of the present disclosure, a material of the dielectric strip and a material of the dielectric layer comprise $TiO_2$.

According to another aspect of the present disclosure, a display device is provided. The display device includes:

a display panel, including a plurality of data lines;

a circuit board; and a chip on film, where the chip on film is any of the chip on films described above, the chip on film is connected between the display panel and the circuit board, and the connecting wire is connected to the data line.

According to another aspect of the present disclosure, lengths of the plurality of the dielectric strips in the second direction increase as lengths of the data lines decrease, and the data line is connected to the connecting wire located at a same side as the dielectric strip.

According to another aspect of the present disclosure, a length of the dielectric layer in the second direction increases as a length of the data line connected to the connecting wire covered by the dielectric layer decreases.

It should be understood that the general description above and the detailed description in the following text are only illustrative and explanatory, and cannot limit the present disclosure.

BRIEF DESCRIPTION OF THE DRAWINGS

The accompanying drawings herein are incorporated into and form a part of the specification, illustrate embodiments consistent with the present disclosure, and are used in conjunction with the specification to explain the principles of the present disclosure. It is apparent that the accompanying drawings in the following description are only some of the embodiments of the present disclosure. For those ordinary skilled in the art, other accompanying drawings may be obtained based on these drawings without creative labor.

DESCRIPTION OF REFERENCE NUMERALS

Figure 1:
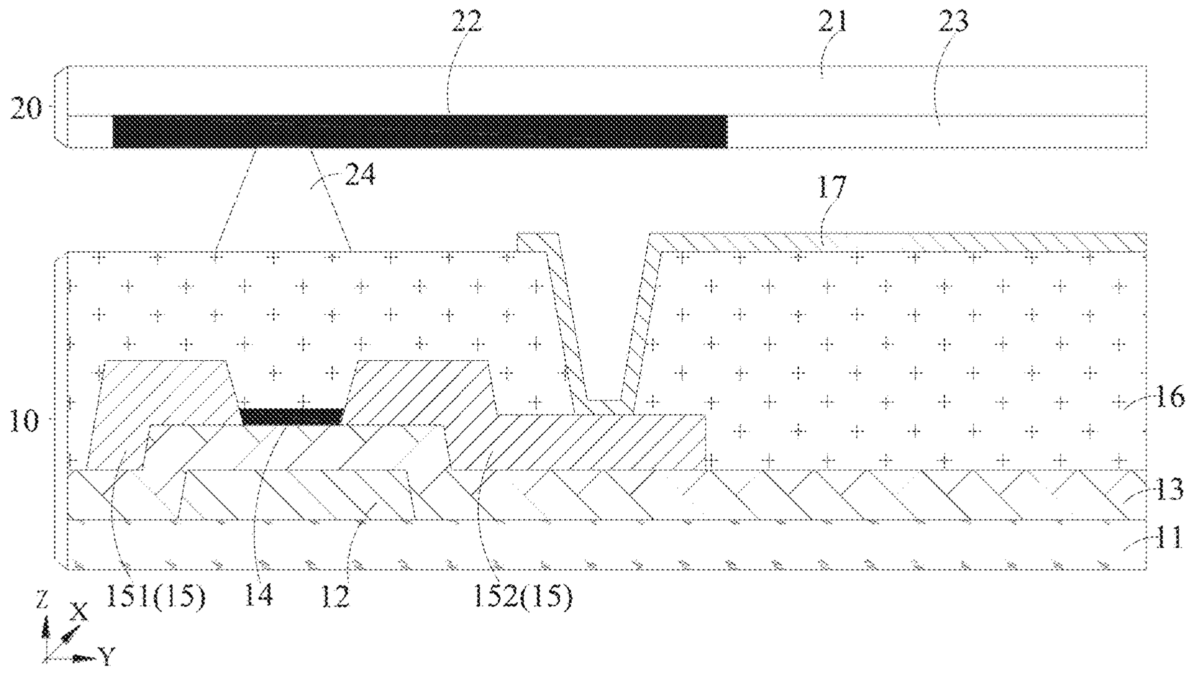
FIG. 1 is a schematic structural diagram of a display panel.

10. array substrate; 20. color film substrate; 30. chip on film;

11. first substrate; 12. gate layer; 13. gate insulating layer; 131. gate line; 14. active layer; 15. source-drain layer; 151. source; 152. drain; 153. data line; 16. planarization layer; 17. pixel electrode;

T. thin film transistor; C. capacitor;

21. second substrate; 22. light-transmitting portion; 23. light-shielding portion; 24. spacer;

31. substrate layer;

32. conductor layer; 321. connecting wire; 321*z*. first left connecting wire; 322*z*. second left connecting wire; 323*z*. third left connecting wire; 324*z*. fourth left connecting wire; 325*z*. fifth left connecting wire; 321*y*. first right connecting wire; 322*y*. second right connecting wire; 323*y*. third right connecting wire; 324*y*. fourth right connecting wire; 325*y*. fifth right connecting wire; 322. gap; 323. first wire; 324. second wire;

33. dielectric strip; 331*z*. first left dielectric strip; 332*z*. second left dielectric strip; 333*z*. third left dielectric strip; 331*y*. first right dielectric strip; 332*y*. second right dielectric strip; 333*y*. third right dielectric strip;

34. dielectric layer; 35. protective layer; 36. integrated circuit;

371. first binding pin; 372. second binding pin; 373. third binding pin; 374. fourth binding pin;

L. symmetry axis; X. first direction; Y. second direction; Z. third direction.

DETAILED DESCRIPTION

Example embodiments are now described more comprehensively with reference to the accompanying drawings. However, the example embodiments are capable of being implemented in a variety of forms and should not be construed as being limited to the embodiments set forth herein. Rather, the provision of these embodiments allows the present disclosure to be comprehensive and complete and conveys the idea of the example embodiments comprehensively to those skilled in the art. The same reference numerals in the drawings indicate the same or similar structures, therefore their detailed descriptions will be omitted. In addition, the accompanying drawings are only illustrative illustrations of the present disclosure and are not necessarily drawn to scale.

Although relative terms such as "up" and "down" are used in this specification to describe a relative relationship between one component and another component indicated in the drawings, these terms are only used for convenience in this specification, for example, according to the direction of the examples described in the drawings. It can be understood that if the device indicated in the drawings is flipped upside down, the component described as "up" may become the component described as "down". When a certain structure is on "top" of another structure, it may mean that a structure is formed integrally on another structure, or that a structure is "directly" set on another structure, or that a structure is "indirectly" set on another structure through yet another structure.

The terms "a", "an", "this", "the", and "at least one" are used for indicating a presence of one or more elements/components/etc. The terms "include" and "have" are used for indicating open inclusion and meaning that there may be additional elements/components/etc. in addition to the listed elements/components/etc. The terms "first", "second", "third", etc. are used only as markers and are not intended to be quantitative limitations of the objects to which they refer.

The inventor has found that the main reason for the poor display image quality after the refresh rate is increased is that the capacitor in the display panel is charged for a shorter period of time when the refresh rate is increased, resulting in insufficient charging of the capacitor, which results in a poor display when the display is performed.

An example embodiment of the present disclosure provides a chip on film 30. Referring to FIGS. 3-10, the chip on film may include a substrate layer 31, a conductor layer 32, a protective layer 35, and a plurality of dielectric strips 33. The conductor layer 32 is arranged at a side of the substrate layer 31. The conductor layer 32 includes a plurality of connecting wires 321 arranged along a first direction X. A gap 322 is provided between two adjacent ones of the connecting wires 321. The dielectric strip 33 is provided in at least part of gaps 322. A length of the dielectric strip 33 in a second direction Y is less than or equal to a length of the gap 322 in the second direction Y. The second direction Y intersects with the first direction X. The protective layer 35 is arranged at a side of the conductor layer 32 and the dielectric strip 33 away from the substrate layer 31. The dielectric strip 33 has a larger dielectric constant than the protective layer 35.

The chip on film 30 of the present disclosure is provided with the dielectric strip 33 in at least part of the gaps 322, and the dielectric strip 33 has a larger dielectric constant than the protective layer 35, so that the capacitance between the connecting wires 321 that are provided with the dielectric strip 33 is increased, and the capacitance of the signal line connected to the connecting wire 321 can be compensated, causing that the display panel is charged more sufficient under the condition that the refresh rate is increased, thereby reducing poor display.

Compared with traditional chip on glass (COG) packaging, the biggest improvement of the chip on film (or chip on flex, COF) is a grain soft film assembly that fixes the chip such as the touch chip on a flexible printed circuit, and a soft additional circuit board being used as a packaging chip carrier to connect the chip with the soft substrate circuit. A more intuitive expression is that the chip (IC) is embedded in the flexible printed circuit (FPC for short). Moreover, the chip on film can be folded to the back, which can be applied to the full screen, and can better realize the anti-static performance of the full screen.

The chip on film 30 is connected to the display panel. In order to more clearly illustrate the chip on film 30, the following is an example of the display panel.

Referring to FIG. 1, the display panel may be a liquid crystal display panel, and the display panel may include an array substrate 10, and a color film substrate 20 arranged opposite to the array substrate 10. An adhesive frame and a liquid crystal layer are arranged in the array substrate 10 and the color film substrate 20, and the liquid crystal layer is arranged within the adhesive frame.

The array substrate 10 may include a first substrate 11. The first substrate 11 may be a glass substrate. Of course, in some other example embodiments of the present disclosure, the first substrate 11 may also be quartz and the like. The first substrate 11 may also include an organic insulating material layer. The organic insulating material layer may be arranged at a side of the glass substrate, and may be a resin material such as polyimide, polycarbonate, polyacrylate, polyetherimide, polyethersulfone, polyethylene terephthalate, and polyethylene naphthalate.

A gate layer 12 may be provided at a side of the first substrate 11, and the gate layer 12 may include a plurality of gate lines 131, a plurality of gates, and a plurality of common sub-electrodes. The gate line 131 extends along the second direction Y. The plurality of common sub-electrodes are arranged in an array. A plurality of common sub-electrodes arranged along the first direction X form a row, and a gate line 131 is provided between two adjacent rows of the common sub-electrodes, i.e., the gate line 131 is provided at a side of the common sub-electrode in the first direction X. Two adjacent common sub-electrodes arranged along the second direction Y are connected as an integrated body. The common electrode is provided in a whole layer, and the common sub-electrodes need to be connected as an integrated body. The material of the gate layer 12 may be metal.

A gate insulating layer 13 is provided at a side of the gate layer 12 away from the first substrate 11. An active layer 14 is provided at a side of the gate insulating layer 13 away from the first substrate 11. The active layer 14 may include a channel portion and a conductor portion. The channel portion is provided at a side of the gate line 131 away from the first substrate 11. A portion of the gate line 131 opposite to the channel portion may serve as the gate. Two conductor portions are connected to two ends of the channel portion in one-to-one correspondence.

A source-drain layer 15 is provided at a side of the active layer 14 away from the first substrate 11. The source-drain layer 15 may include a source 151, a drain 152, a connecting portion, and a data line 153. The data line 153 extends along the first direction X. The second direction Y intersects with the first direction X. For example, the second direction Y may be perpendicular to the first direction X.

One end of the source 151 is connected to the data line 153, and the other end of the source 151 is connected to one conductor section. One end of the drain 152 is connected to the other conductor portion. The gate, the channel portion, the source 151, the drain 152, and the two conductor portions form a thin film transistor T.

It should be illustrated that the thin film transistor T illustrated in this specification is a bottom-gate type thin film transistor T. In other example embodiments of the present disclosure, the thin film transistor T may also be a top-gate type or a double-gate type. The specific structure of the thin film transistor T is not further described herein. Furthermore, the functions of the "source 151" and the "drain" are sometimes switched with each other when a thin film transistor T of an opposite polarity is used, or when the direction of the current is changed during operation of the circuit, and the like. Therefore, in this specification, the "source 151" and the "drain" are interchangeable.

A planarization layer 16 is provided at a side of the source-drain layer 15 away from the first substrate 11. The planarization layer 16 is provided with a via. A pixel electrode 17 is provided at a side of the planarization layer 16 away from the first substrate 11. The pixel electrode 17 is connected to the other end of the drain 152 through the via. The pixel electrode 17 and the common electrode form a capacitor C that drives the rotation of the liquid crystal molecules in the liquid crystal layer.

In this example embodiment, the color film substrate 20 may include a second substrate 21, a light-transmitting portion 22, and a light-shielding portion 23. The light transmitting portion 22 is arranged at a side of the second substrate 21 close to the array substrate 10. The light-transmitting portion 22 is arranged opposite to the pixel area. The light-shielding portion 23 is provided at the side of the second substrate 21 close to the array substrate 10. The light-shielding portion 23 is arranged opposite to the gap between the pixel areas.

A plurality of spacers 24 are also provided between the color film substrate 20 and the array substrate 10.

Figure 2:
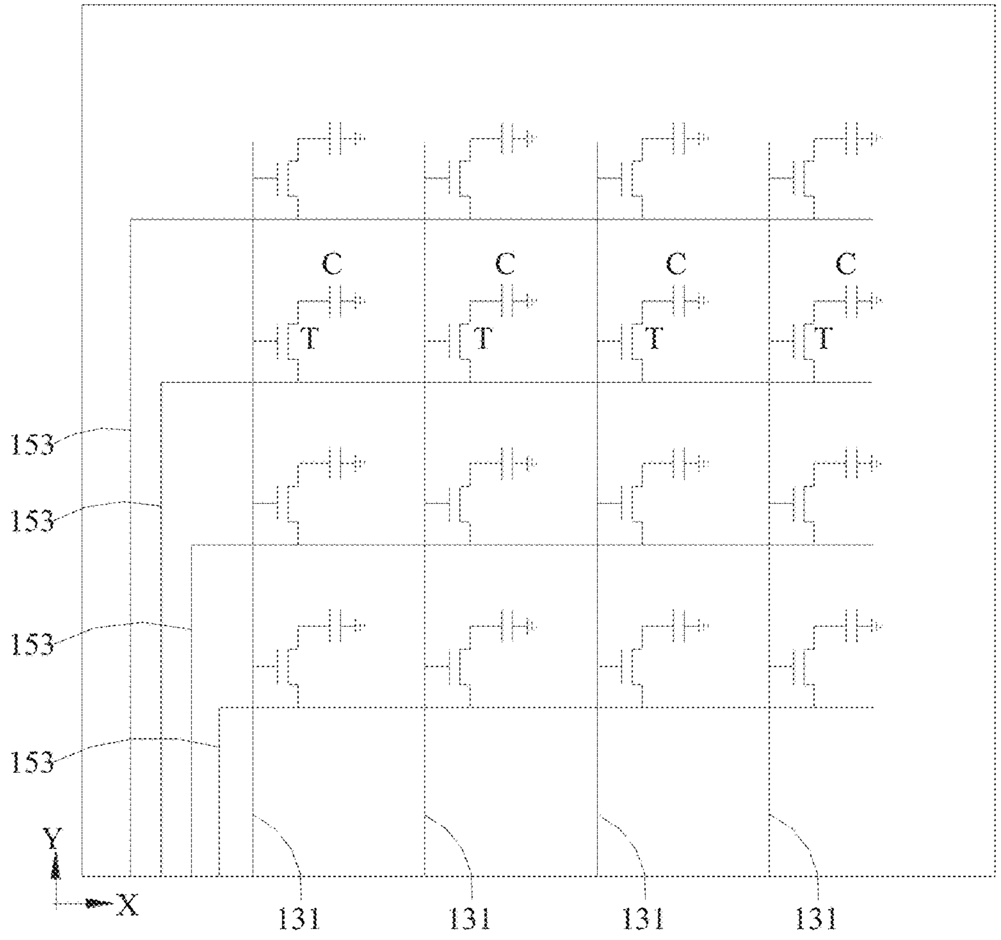
FIG. 2 is a schematic structural diagram of an equivalent circuit of a display panel.

Referring to FIG. 2, a data line 153 is connected to the sources 151 of the plurality of thin film transistors T arranged along the first direction X. In the case where the thin film transistor Tis turned on, one end of the data line 153 is connected to the pixel electrode 17 of the capacitor C, and the other end of the data line 153 is connected to the chip on film 30. The length of the data line 153 may have an impact on the capacitor C. Inconsistencies in the length of the data lines 153 connected to respective rows of thin film transistors T lead to differences in the display effect. In the case of a low refresh rate, the length of the data line 153 has little effect on the charging effect of the capacitor C. In the case of a high refresh rate, the short charging time of the capacitor C makes the length of the data line 153 have a greater effect on the charging effect of the capacitor C.

Of course, the display panel may also be an organic electroluminescence display (OLED) display substrate, a quantum dot light emitting diodes (QLED) display substrate, and the like.

An example of the structure of the chip on film 30 is described below. Referring to FIGS. 3-10, a number of representative connecting wires 321, first wires 323, and second wires 324 are shown in the drawings by way of example only.

In this example embodiment, the material of the substrate layer 31 may be a flexible insulating material. For example, the material of the substrate layer 31 may be polyimide (PI); the material of the substrate layer 31 may also be a resin material such as polycarbonate, polyacrylate, polyetherimide, polyethersulfone, polyethylene terephthalate, and polyethylene naphthalate. The dielectric constant of the substrate layer 31 is about 3.0. The thickness of the substrate layer 31 is greater than or equal to 33 microns, and is less than or equal to 35 microns. For example, the thickness of the substrate layer 31 may be 34 microns, and, of course, the thickness of the substrate layer 31 may be set to another value as desired.

Figure 4:
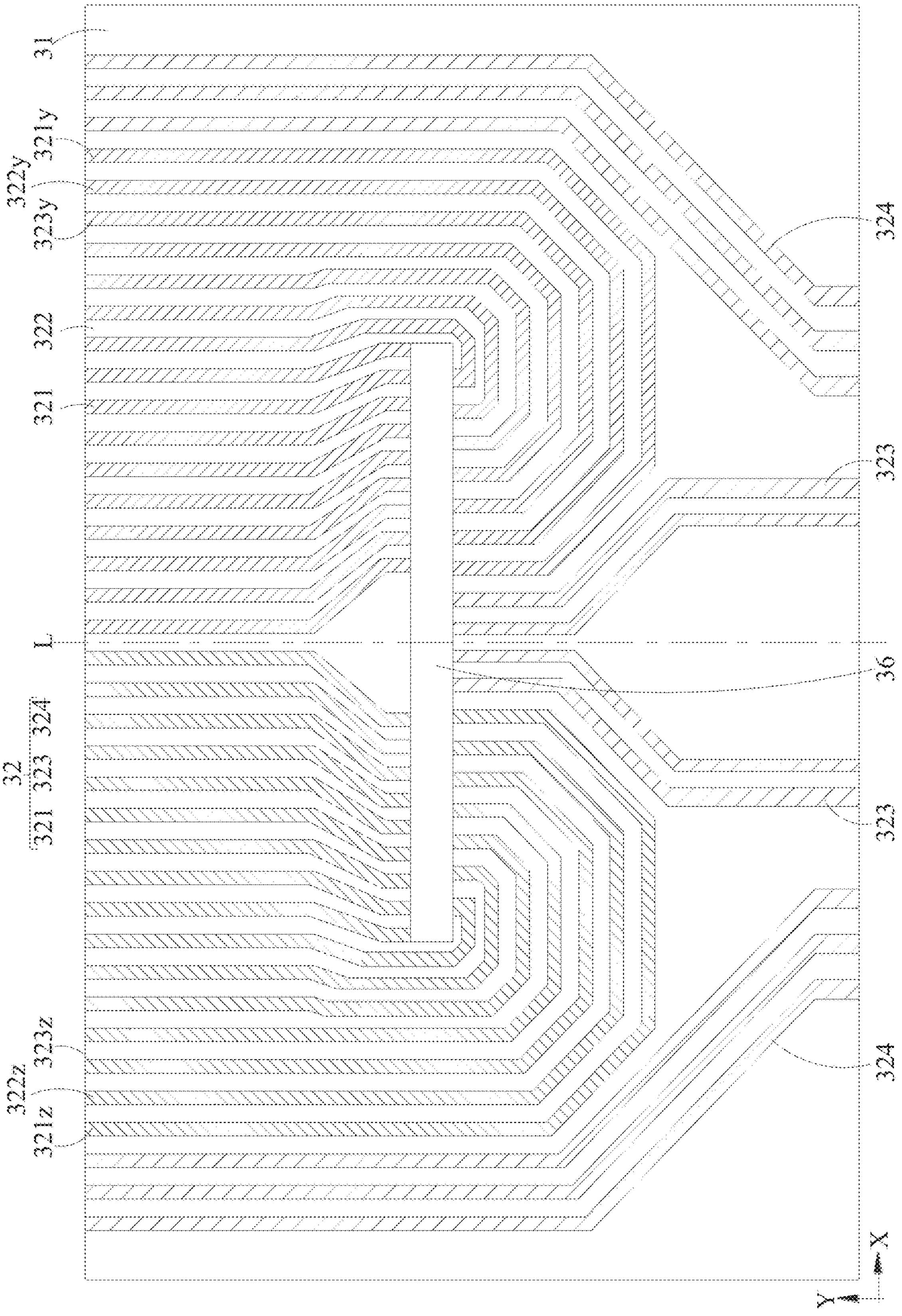
FIG. 4 is a schematic structural diagram of the chip on film in FIG. 3 after a conductor layer is formed on a substrate layer.

In this example embodiment, referring to FIG. 4, the conductor layer 32 is provided at a side of the substrate layer 31. The conductor layer 32 may include a plurality of connecting wires 321. A gap 322 is provided between two adjacent ones of the connecting wires 321. The plurality of connecting wires 321 are arranged sequentially along the first direction X. One end of the plurality of connecting wires 321 may be used for connecting to the data line 153, and the other end of the plurality of connecting wires 321 may be connected to the integrated circuit (IC) 36.

Figure 3:
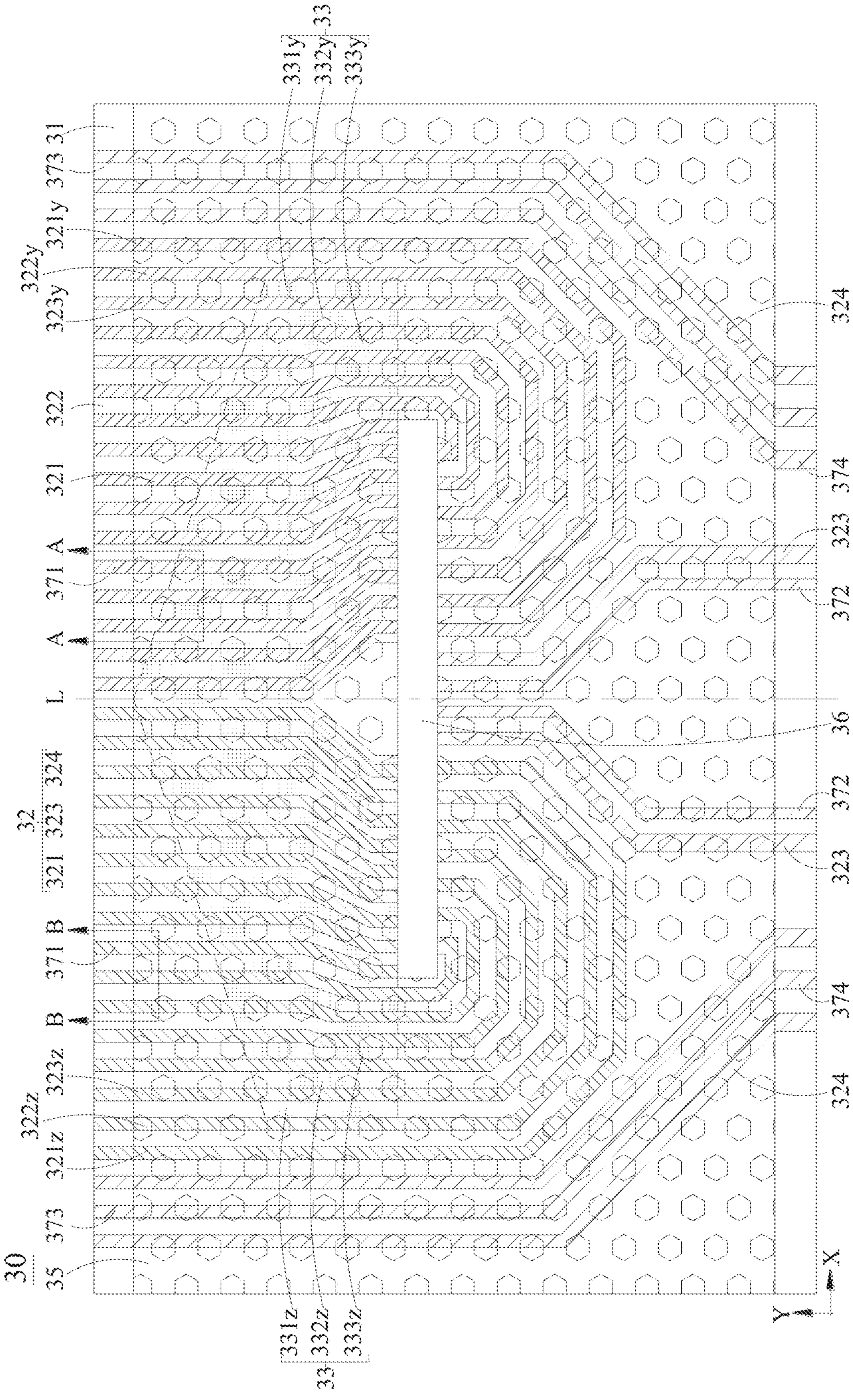
FIG. 3 is a schematic structural diagram of a chip on film of an example embodiment of the present disclosure.

Referring to FIG. 3, one end of the plurality of connecting wires 321 connected to the data line 153 is exposed to form a plurality of first binding pins 371. The first binding pin 371 may be used for connecting to an output signal end and may be used for inputting a display signal, e.g., the first binding pin 371 may be connected to the data line 153. Specifically, one end of the plurality of connecting wires 321 connected to the data line 153 extends to an edge of a side of the substrate layer 31 in the second direction Y and is not covered by the dielectric layer 34 and the protective layer 35, forming the plurality of first binding pins 371. The plurality of first binding pins 371 are used for binding to a binding area of the display panel.

Referring to FIG. 4, the other end of the plurality of connecting wires 321 is connected to the integrated circuit 36. Since the length of the integrated circuit 36 in the first direction X is smaller than the length of the substrate layer in the first direction X, and the integrated circuit 36 is provided with pins connected to the connecting wire 321 on both sides of the integrated circuit 36 in the second direction Y, and there are also pins on the middle portion of the integrated circuit 36 that are not connected to the connecting wire 321, and thus, the connecting wire 321 needs to be provided in a bent shape.

One portion of the plurality of connecting wires 321 is a first connecting wire, and the other portion of the plurality of connecting wires 321 is a second connecting wire. The first connecting wire is connected to a side of the integrated circuit 36 close to the first binding pin 371, and the second connecting wire is connected to a side of the integrated circuit 36 away from the first binding pin 371.

Specifically, the first connecting wire may be provided in a bent shape having two corners. The second connecting wire may be provided in a bent shape having four or five corners.

Moreover, the plurality of connecting wires 321 are arranged symmetrically relative to a symmetry axis, and the symmetry axis L is a central axis, extending along the second direction Y, of the substrate layer 31. Further, the data lines 153 connected to the connecting wires 321 are also arranged symmetrically relative to the symmetry axis. To avoid line crossing and to facilitate control, the connecting wire 321 that is located outermost is generally connected to the data line 153 that is located outermost, the connecting wire 321 that is located innermost is connected to the data line 153 that is located innermost, and the connecting wire 321 that is located in the middle is connected to the data line in turn.

It should be illustrated that "inner" and "outer" are relative terms. For the data line 153, the side close to the display area of the display panel is the inner side, and side away from the display area of the display panel is the outer side. For the connecting wire 321, the side close to the integrated circuit 36 of the chip on film 30 is the inner side, and the side away from the integrated circuit 36 of the chip on film 30 is the outer side.

Of course, in other example embodiments of the present disclosure, the plurality of connecting wires 321 may all be connected to the side of the integrated circuit 36 close to the first binding pin 371, and the plurality of connecting wires 321 may be provided in a straight-line shape instead of being provided in a bent shape. Furthermore, the number of corners of the plurality of connecting wires 321 may be provided as desired. The plurality of connecting wires 321 may also be provided asymmetrically. Please continue to refer to FIGS. 3 and 4, the conductor layer 32 may also include a plurality of first wires 323 that are spaced apart. One end of the plurality of first wires 323 is connected to the integrated circuit 36, and the other end of the plurality of first wires 323 is exposed to form a plurality of second binding pins 372. The second binding pin 372 is used for connecting to an input signal end, e.g., the second binding pin 372 may be connected to VGH, VGL, GND and the like. Specifically, the other end of the plurality of first wires 323 extends to an edge of a side of the substrate layer 31 away from the first binding pin 371 and is not covered by the protective layer 35, forming the plurality of second binding pins 372, such that the first binding pin 371 and the second binding pin 372 are located at opposite sides of the integrated circuit 36 in the second direction Y.

The conductor layer 32 may further include a plurality of second wires 324 that are spaced apart. One end of the plurality of second wires 324 extends to an edge of a side of the substrate layer 31 in the second direction Y, and is exposed to form a plurality of third binding pins 373. The plurality of third binding pins 373 and the plurality of first binding pins 371 are arranged in a row. The other end of the plurality of second wires 324 extends to an edge of an opposite side of the substrate layer 31 in the second direction Y, and is exposed to form a plurality of fourth binding pins 374. The plurality of fourth binding pins 374 and the plurality of second binding pins 372 are arranged in a row.

Moreover, the first wire 323 and the second wire 324 may also be provided in a bent shape in order to avoid the integrated circuit 36, and the specific number of corners may also be set as desired.

The material of the conductor layer 32 may be copper, and of course, the material of the conductor layer 32 may also be other metals with better conductivity. The thickness of the conductor layer 32 is greater than or equal to 6.5 microns, and is less than or equal to 9.5 microns, for example, the thickness of the conductor layer 32 may be 7 microns, 8 microns, 9 microns, and so on, and of course, the thickness of the conductor layer 32 may be set to another value as desired.

Figure 5:
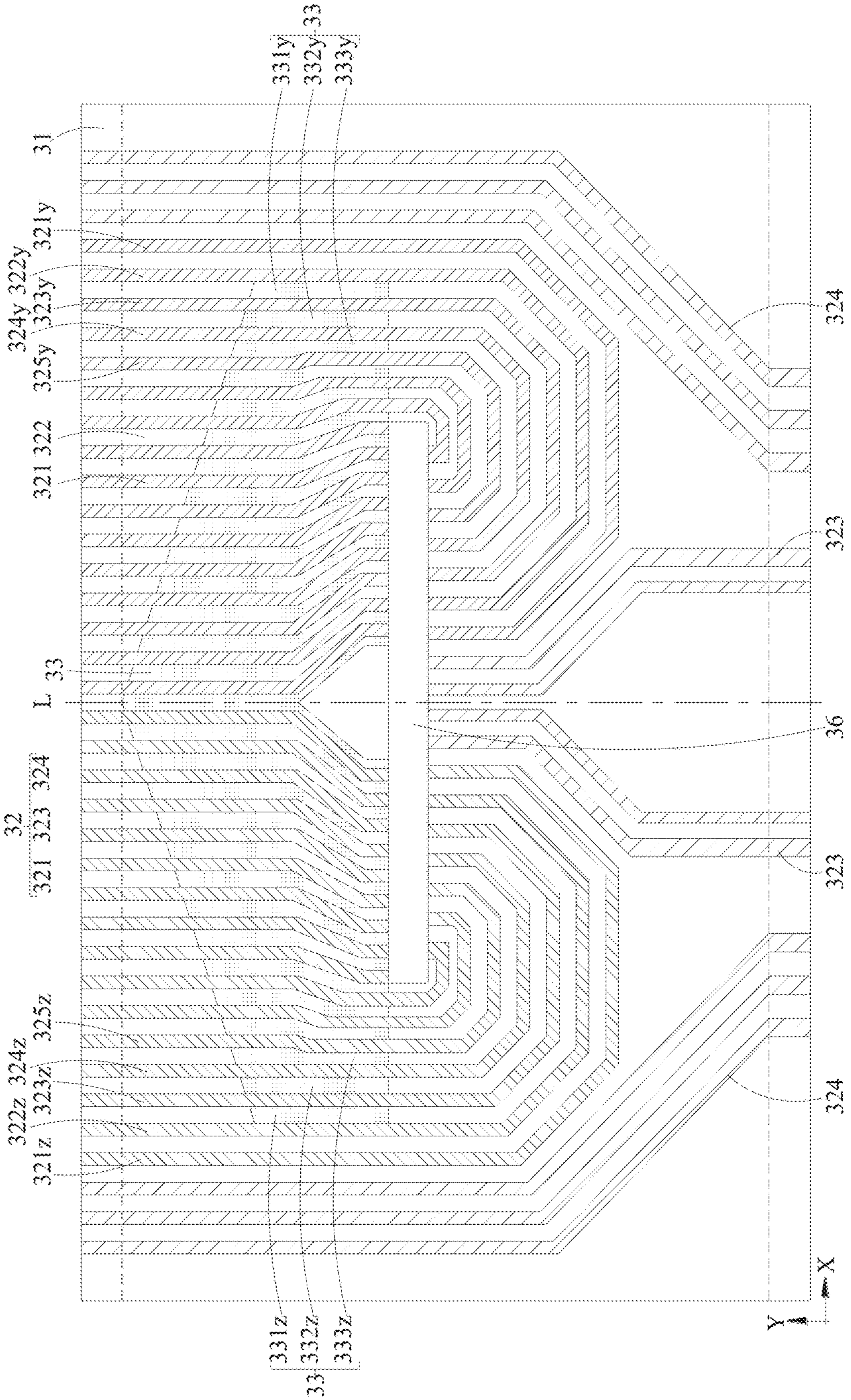
FIG. 5 is a schematic structural diagram of the chip on film after dielectric strips are formed on the basis of FIG. 4.

In this example embodiment, referring to FIGS. 3 and 5, a split line of the connecting wires 321 and the first binding pins 371 is shown by a dashed line in FIG. 5. The dielectric strip 33 is provided in at least part of the gaps 322. The length of the dielectric strip 33 is less than or equal to the length of the gap 322. The width of the dielectric strip 33 is equal to the width of the gap 322. The dielectric strip 33 has a larger dielectric constant than the protective layer 35, thus causing the capacitance between two adjacent connecting wires 321 to increase.

Since the outermost connecting wire 321 corresponds to connecting the outermost data line 153, and the outermost data line 153 has the largest length and the largest capacitance, the lengths and the capacitances of the inner data lines 153 are gradually shortened, capacitance compensation does not need to be applied to the outermost data line 153. The outermost data line 153 may be used as a benchmark, and the capacitances of the other data lines 153 need to be compensated to be substantially the same as the capacitance of the outermost data line 153.

For convenience of subsequent description, the plurality of connecting wires 321 starting from the left side of the first direction X are, in turn, the first left connecting wire 321*z*, the second left connecting wire 322*z*, and the third left connecting wire 323*z* . . . ; and the lengths of the data lines 153 connected to these connecting wires 321 are shortened in turn. The plurality of connecting wires 321 starting from the right side of the first direction X are, in turn, the first right connecting wire 321*y*, the second right connecting wire 322*y*, the third right connecting wire 323*y* . . . ; and the lengths of the data lines 153 connected to these connecting wires 321 are shortened in turn.

Specifically, no dielectric strip 33 is provided at either side of the two connecting wires 321 (the first left connecting wire 321*z* and the first right connecting wire 321*y*) that are located outermost. Thus, there is no capacitance compensation for these two connecting wires 321. A first left dielectric strip 331*z* is provided between the second left connecting wire 322*z* and the third left connecting wire 323*z*, a second left dielectric strip 332*z* is provided between the third left connecting wire 323*z* and the fourth left connecting wire 324*z*, and a third left dielectric strip 333*z* is provided between the fourth left connecting wire 324*z* and the fifth left connecting wire 325*z* . . . ; i.e., the first left dielectric strip 331*z*, the second left dielectric strip 332*z*, the third left dielectric strip 333*z* are arranged sequentially at the left side of the first direction X. Moreover, the lengths of these dielectric strips 33 gradually increase, because the lengths of the data lines 153 connected to the connecting wires 321 located at the same side (left or right) as these dielectric strips 33 gradually decrease, and the capacitances that need to be compensated of these data lines 153 gradually increase. Increasing the length of the dielectric strip 33 can increase the capacitance of the connecting wire 321, thereby increasing the capacitance of the data line 153.

Similarly, a first right dielectric strip 331*y* is provided between the second right connecting wire 322*y* and the third right connecting wire 323*y*, a second right dielectric strip 332*y* is provided between the third right connecting wire 323*y* and the fourth right connecting wire 324*y*, and a third right dielectric strip 333*y* is provided between the fourth right connecting wire 324*y* and the fifth right connecting wire 325*y* . . . ; i.e., the first right dielectric strip 331*y*, the second right dielectric strip 332*y*, the third right dielectric strip 333*y* . . . are arranged sequentially at the right side of the first direction X. Moreover, the lengths of these dielectric strips 33 gradually increase, because the lengths of the data lines 153 connected to the connecting wires 321 located at the same side (left or right) as these dielectric strips 33 gradually decrease, and the capacitances that need to be compensated of these data lines 153 gradually increase. Increasing the length of the dielectric strip 33 can increase the capacitance of the connecting wire 321, thereby increasing the capacitance of the data line 153.

Moreover, in the first direction X, the data lines 153 may be arranged symmetrically relative to a symmetry axis, and the connecting wires 321 connecting the data lines 153 may also be arranged symmetrically relative to the symmetry axis. Thus, the plurality of dielectric strips 33 may also be arranged symmetrically relative to the symmetry axis Specifically, the positions of the first left dielectric strip 331*z* and the first right dielectric strip 331*y* are symmetrical to each other, and the length of the first left dielectric strip 331*z* is the same as the length of the first right dielectric strip

331*y*; the positions of the second left dielectric strip 332*z* and the second right dielectric strip 332*y* are symmetrical to each other, and the length of the second left dielectric strip 332*z* is the same as the length of the second right dielectric strip 332*y*; the positions of the third left dielectric strip and the third right dielectric strip 333*y* are symmetrical to each other, and the length of the third left dielectric strip 333*z* is the same as the length of the third right dielectric strip 333*y*. The symmetry axis L is a central axis, extending along the second direction Y, of the integrated circuit 36. Moreover, lengths of the plurality of dielectric strips 33 in the second direction Y decrease as distances between the dielectric strips 33 and the symmetry axis L increases.

The symmetrical setting not only facilitates calculation during design, but also facilitates process operation during preparation. Furthermore, in the case where the pin density of the first binding pin 371 is different from that of the integrated circuit 36, the spacing between two adjacent connecting wires 321 is not constant, but gradually widens from the integrated circuit 36 to the first binding pin 371, resulting in the width of connecting wire 321 not being constant, but gradually widening from the integrated circuit 36 to the first binding pin 371. In this case, the symmetrically setting of the plurality of dielectric strips 33 is more convenient for calculation and operation, and can achieve high accuracy.

Of course, in some other example embodiments of the present disclosure, the spacing between two adjacent connecting wires 321 may be constant all the time, and the positions of the first left dielectric strip 331*z* and the first right dielectric strip 331*y* may be asymmetrical, as long as the length of the first left dielectric strip 331*z* is the same as the length of the first right dielectric strip 331*y* to achieve the same capacitance compensation for the data line 153. Additionally, in the case that the spacing between two adjacent connecting wires 321 is not constant, the positions of the first left dielectric strip 331*z* and the first right dielectric strip 331*y* may be asymmetrical, as long as it is ensured that they are each capable of achieving the capacitance to be compensated.

Please continue to refer to FIGS. 3 and 5, the plurality of dielectric strips 33 are provided at the side of the integrated circuit 36 close to the first binding pin 371, which facilitates calculation during design and is convenient for process operation during the preparation due to the neater arrangement of connecting wires at the side of the integrated circuit 36 close to the first binding pin 371. Ends of the plurality of dielectric strips 33 close to the integrated circuit 36 are flush, which is also convenient for calculation and drawing during design, and is convenient for process operation during preparation. Moreover, the ends of the plurality of dielectric strips 33 close to the integrated circuit 36 are substantially coplanar with the surface of the integrated circuit 36 close to the first binding pin 371. Of course, in other example embodiments of the present disclosure, the ends of the plurality of dielectric strips 33 close to the integrated circuit 36 may not be flush, for example, the plurality of dielectric strips 33 may be provided in a structure symmetrical to a symmetry axis along the second direction, such that the ends at neither sides of the plurality of dielectric strips 33 are not flush; or the ends of the plurality of dielectric strips 33 away from the integrated circuit 36 may be provided flush.

The dielectric constant of the dielectric strip 33 increases as a minimum target compensation capacitance of the chip on film 30 increases; and/or the length of the dielectric layer 33 in the second direction Y increases as the minimum target compensation capacitance of the chip on film 30 increases. That is, the increase in the minimum target compensation capacitance of the chip on film 30 can be achieved by increasing the dielectric constant of the dielectric strip 33 or by increasing the length of the dielectric strip 33 in the second direction Y; it is also possible to increase the dielectric constant of the dielectric strip 33 while increasing the length of the dielectric strip 33 in the second direction Y.

The target compensation capacitance is the capacitance that the chip on film 30 needs to compensate for the data line, but since the capacitance that needs to be compensated for each data line is different, ranging from large to small, there are a plurality of target compensation capacitances for the chip on film 30, ranging from large to small, and the minimum target compensation capacitance is used as a benchmark for ease of comparison. Since the gap 322 between two adjacent connecting wires 321 is closely related to the size of the display panel, the size of the integrated circuit 36, and the pixel density of the display panel, etc., the gap 322 between two adjacent connecting wires 321 cannot be arbitrarily altered, resulting in the width of the dielectric strip 33 in the second direction Y being fixed, and it is necessary to increase the minimum target compensation capacitance of the chip on film 30. Increasing the minimum target compensation capacitance of the chip on film 30 can be achieved by increasing the length of the dielectric strip 33 or by increasing the dielectric constant of the dielectric strip 33; however, the length of the dielectric strip 33 is related to the length of the connecting wire 321, and in the case where the minimum target compensation capacitance is large and the length of the connecting wire 321 is short, the target compensation capacitance cannot be achieved by increasing the length of the dielectric strip 33, but can be achieved by increasing the dielectric constant of the dielectric strip 33.

Figure 6:
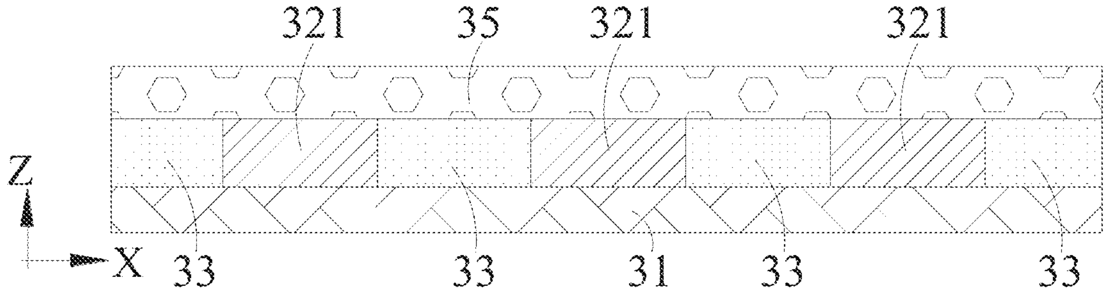
FIG. 6 is a schematic cross-sectional view after sectioning in accordance with A-A in FIG. 3.

In this example embodiment, referring to FIG. 6, the dielectric strip 33 has a same height in a third direction Z as the connecting wire 321. The third direction Z is perpendicular to a surface of the substrate layer 31 close to the conductor layer 32, i.e., the dielectric strip 33 fills up the gap 322 between two adjacent connecting wires 321, causing that the surface of the dielectric strip 33 away from the substrate layer 31 is substantially coplanar with the surface of the connecting wire 321 away from the substrate layer 31, facilitating the preparation of the protective layer 35, and enabling the protective layer 35 to be completely adhered to the surface of the dielectric strip 33 away from the substrate layer 31 and the surface of the connecting wire 321 away from the substrate layer 31 without any gap, avoiding damage caused by corrosion to the dielectric strip 33 and the connecting wire 321 after water vapor enters the chip on film 30 through the gap, and ensuring the sealing effect of the protective layer 35 on the dielectric strip 33 and the connecting wire 321.

Of course, in other example embodiments of the present disclosure, the height of the dielectric strip 33 in the third direction Z may also be less than the height of the connecting wire 321 in the third direction Z. The height of the dielectric strip 33 in the third direction Z may also be larger than the height of the connecting wire 321 in the third direction Z. In this case, a filling adhesive layer may be provided on the protective layer 35, the surface of the dielectric strip 33 away from the substrate layer 31, and the surface of the connecting wire 321 away from the substrate layer 31. The sealing effect of the dielectric strip 33 and the connecting wire 321 can be achieved through the filling adhesive layer, avoiding damage caused by corrosion to the dielectric strip 33 and the connecting wire 321 after water vapor enters the chip on film 30 through the gap.

Figure 7:
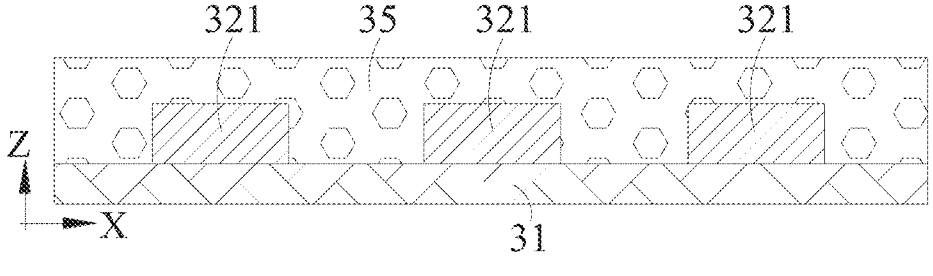
FIG. 7 is a schematic cross-sectional view after sectioning in accordance with B-B in FIG. 3.

In this example embodiment, please continue to refer to FIG. 3, the protective layer 35 is provided at the side of the dielectric strip 33 away from the substrate layer 31 and the side of the connecting wire 321 away from the substrate layer 31. Referring to FIG. 7, the protective layer 35 is also provided between two adjacent connecting wires 321 that are not provided with the dielectric strip 33, causing that only the dielectric strip 33 is provided between some adjacent connecting wires 321, while the dielectric strip 33 and the protective layer 35 are provided between some adjacent connecting wires 321, and that the protective layer 35 not only protects the connecting wire 321 and the dielectric strip 33, but also isolates two adjacent connecting wires 321.

The material of the protective layer 35 may be solder resist (SR). The solder resist is a type of overlay film used for providing dielectric and mechanical shielding during and after the soldering. The solder resist may be in the form of a liquid or a dry film. That is, the liquid material of the solder resist may be coated to the side of the dielectric strip 33 away from the substrate layer 31 and the side of the connecting wire 321 away from the substrate layer 31, and dried to form the protective layer 35; or the protective layer 35, which is formed as a dry film, may be directly affixed to the side of the dielectric strip 33 away from the substrate layer 31 and the side of the connecting wire 321 away from the substrate layer 31. The dielectric constant of the protective layer 35 is about 3.0. Without providing the dielectric strip 33, the capacitance formed between the connecting wires 321 is on the order of $10^{-1}$ pF, and it is more difficult to compensate for the pF order.

Figure 8:
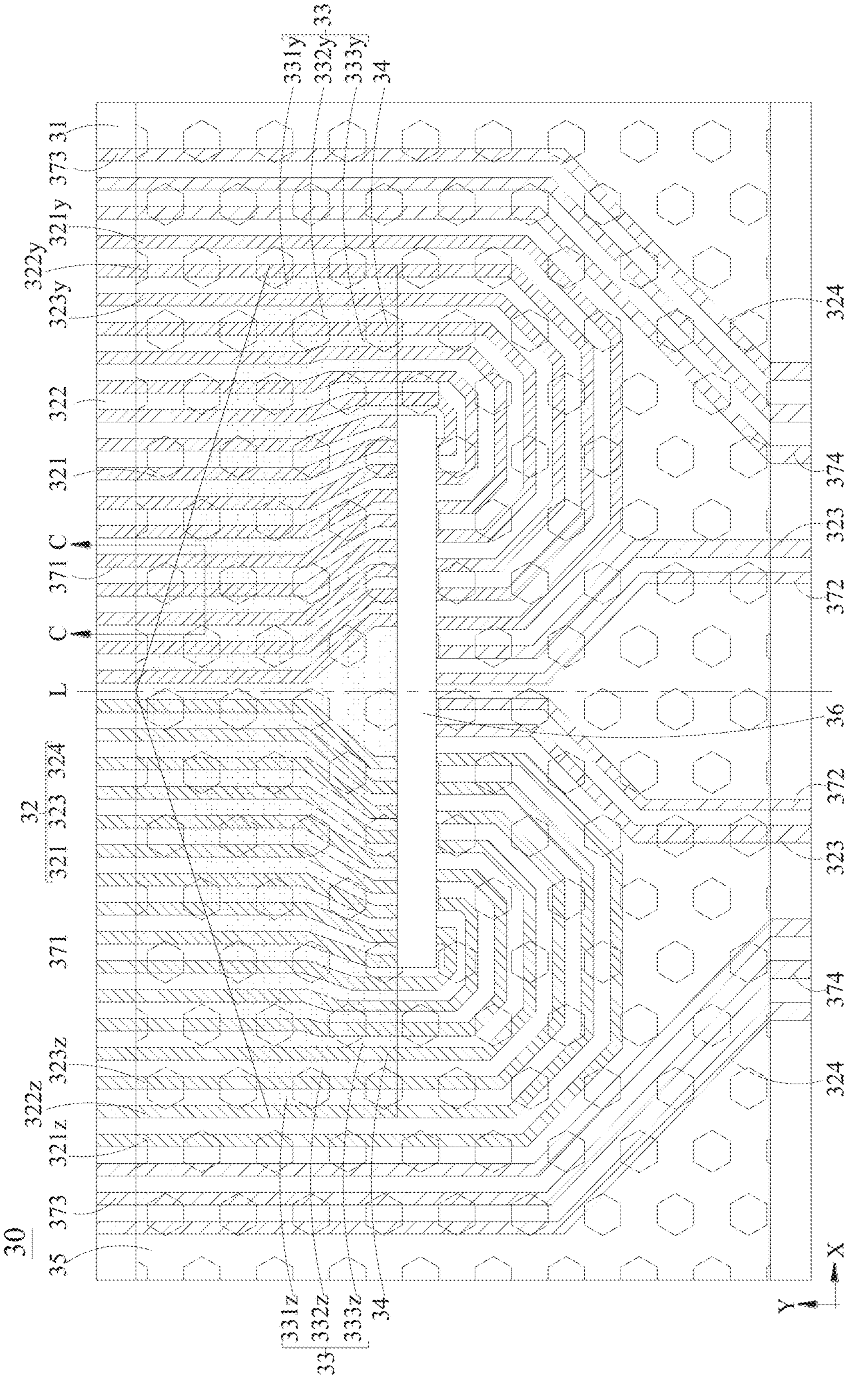
FIG. 8 is a schematic structural diagram of a chip on film of another example embodiment of the present disclosure.
Figure 9:
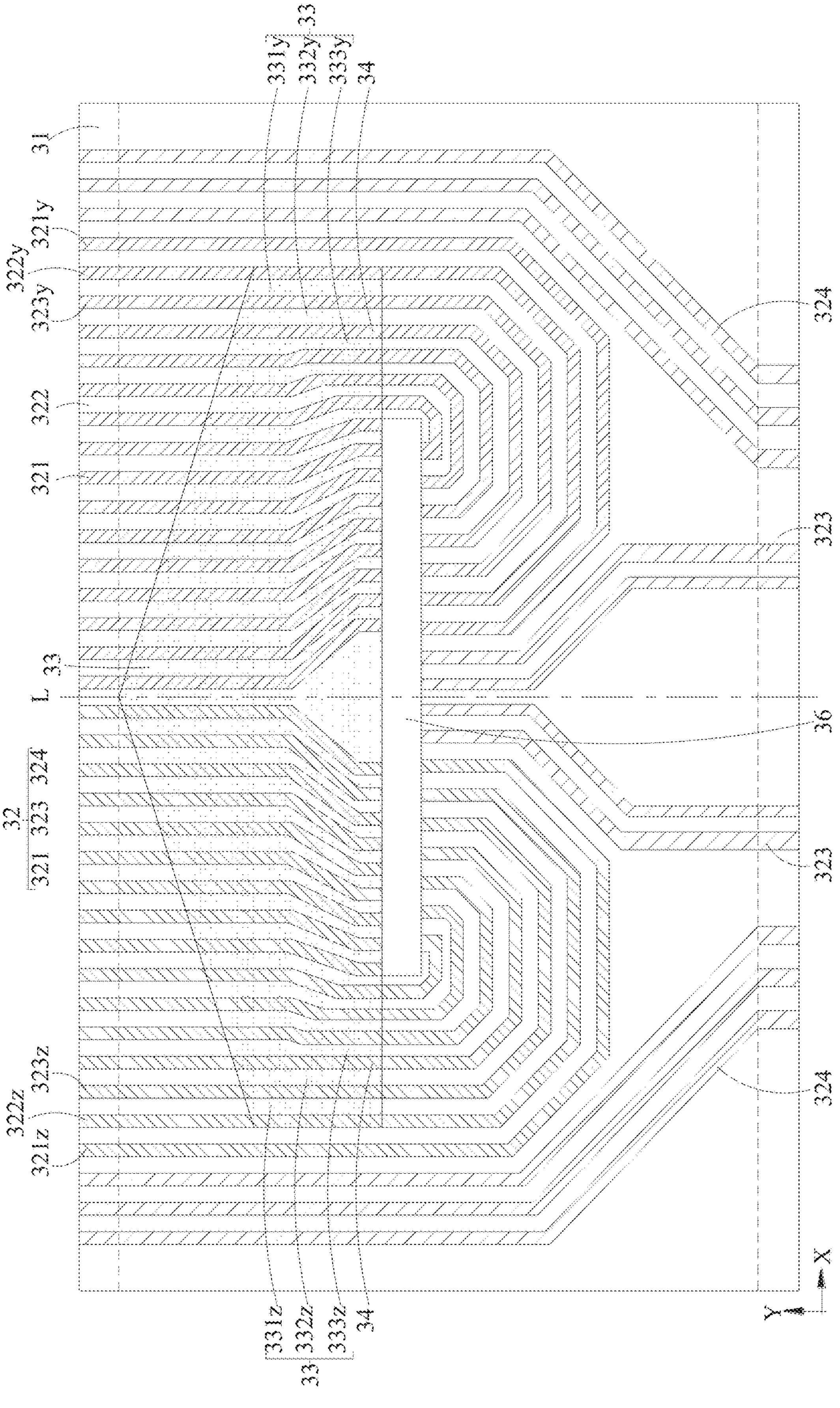
FIG. 9 is a schematic structural diagram of the chip on film after a dielectric layer is formed on the basis of FIG. 5.

Referring to FIG. 8 and FIG. 9, a split line of the connecting wires 321 and the first binding pins 371 is shown by a dashed line in FIG. 9. In another example embodiment of the present disclosure, the chip on film 30 may further include a dielectric layer 34, the dielectric layer 34 is provided between the conductor layer 32 and the dielectric strip 33 and the protective layer 35, i.e., the dielectric layer 34 is provided at the side of the conductor layer 32 and the dielectric strip 33 away from the substrate layer 31, and the protective layer 35 is provided at the side of the dielectric layer 34 away from the substrate layer 31. An orthographic projection of the protective layer 35 on the substrate layer 31 covers and is larger than an orthographic projection of the dielectric layer 34 on the substrate layer 31. The dielectric layer 34 has the same dielectric constant as the dielectric strip 33. The dielectric layer 34 is connected to the plurality of dielectric strips 33 as an integrated body.

Specifically, neither of the two connecting wires 321 (the first left connecting wire 321*z* and the first right connecting wire 321*y*) located outermost are provided with the dielectric layer 34 at the side of the outermost connecting wire 321 away from the substrate layer 31. Therefore, no capacitance compensation is applied to these two connecting wires 321. The dielectric layer 34 is provided at the side of the second left connecting wire 322*z* away from the substrate layer 31 to the side of the second right connecting wire 322*y* away from the substrate layer 31, and the dielectric layer 34 is provided at the side of the dielectric strip 33, between the second left connecting wire 322*z* and the second right connecting wire 322*y*, away from the substrate layer 31. The above dielectric layer 34 is connected to form a sheet.

The length of the dielectric layer 34 in the first direction X increases as the length of the data line 153 connected to the connecting wire 321 covered by the dielectric layer 34 decreases. It is possible to split the dielectric layer 34 into a plurality of strips extending along the second direction Y. The dielectric layer 34 located at the side of the dielectric strip 33 away from the substrate layer 31 is of the same length in the second direction Y as the dielectric strip 33, such that an outermost edge line of an orthographic projection, on the substrate layer 31, of the plurality of the dielectric strips 33 coincides with an edge line of the orthographic projection, on the substrate layer 31, of the dielectric layer 34. The length, in the first direction X, of the dielectric layer 34 located at the side of the connecting wire 321 away from the substrate layer 31 may be the same as the length of the adjacent dielectric layer 34, which makes one side of the dielectric layer 34 to be formed into a ladder shape, and the ladder shape of the dielectric layer 34 makes it require a higher degree of precision for the process. However, since the width of the connecting wire 321 is thin and the length of the dielectric strip 33 is also thin, one side of the dielectric layer 34 can be provided in an inclined shape, which facilitates the subsequent process operation, and is less demanding to the process and reduces the cost.

Moreover, in the first direction X, since the data lines 153 may be arranged symmetrically relative to a symmetry axis, the connecting wires 321 connecting the data lines 153 may also be arranged symmetrically relative to the symmetry axis, and the plurality of dielectric strips 33 may also be arranged symmetrically relative to the symmetry axis. Thus, the dielectric layer 34 may also be arranged symmetrically relative to the symmetry axis. Specifically, the symmetry axis L is a central axis, extending along the second direction Y, of the integrated circuit 36. The central axis, extending along the second direction Y, of the integrated circuit 36 is colinear with the central axis, extending along the second direction Y, of the substrate layer 31. The symmetrical setting not only facilitates calculation during design, but also facilitates process operation during preparation.

The length of the dielectric layer 34 in the second direction Y decreases as the distance between the dielectric layer 34 and the symmetry axis L increases. Moreover, the side surface of the dielectric layer 34 close to the integrated circuit 36 is provided as a plane parallel to the first direction X, the side surface of the dielectric layer 34 close to the integrated circuit 36 is coplanar with the side surface of the plurality of dielectric strips 32 close to the integrated circuit 36, and the side surface of the dielectric layer 34 close to the integrated circuit 36 is adhered to the side surface of the integrated circuit 36, in order to ensure sealing effect of the integrated circuit 36. The side surface of the dielectric layer 34 away from the integrated circuit 36 intersects with the first direction, and the side surface of the dielectric layer 34 away from the integrated circuit 36 is coplanar with the side surface of the plurality of dielectric strips 32 away from the integrated circuit 36.

The dielectric layer 34 may satisfy the following relationship: y=ax+b; where y is the length, in the second direction Y, of the dielectric layer 34 covered by the connecting wire 321; x is the ordering of the connecting wire 321, which takes on the value of a natural number, e.g., the second left connecting wire 322*z* and the second right connecting wire 322*y* correspondingly take on the value of 0, the third left connecting wire 323*z* and the third right connecting wire 323*y* correspondingly take the value of 1, the fourth left connecting wire 321 and the fourth right connecting wire 321 correspondingly take the value of 2, and so on up to the middle-most connecting wire 321, b is the length of the first left dielectric strip 331*z* or the length of the first right dielectric strip 331*y*; a is a slope of a straight line, i.e., the ratio of the difference in length, in the first direction X, of the dielectric layer 34 covered by two adjacent connecting wires 321 to the spacing between two adjacent connecting wires 321.

The dielectric constant of the dielectric layer 34 increases as the minimum target compensation capacitance of the chip on film 30 increases, and/or the length of the dielectric layer 34 in the second direction Y increases as the minimum target compensation capacitance of the chip on film 30 increases. That is, the increase in the minimum target compensation capacitance of the chip on film 30 can be achieved by increasing the dielectric constant of the dielectric layer 34 or by increasing the length of the dielectric layer 34 in the second direction Y; it is also possible to increase the dielectric constant of the dielectric layer 34 while increasing the length of the dielectric layer 34 in the second direction Y.

For example, when the minimum target compensation capacitance of the chip on film 30 is larger than or equal to five times an original capacitance, the dielectric constant of the dielectric layer 34 and the dielectric constant of the dielectric strip 33 may be larger than or equal to 60, and a sum of the thickness of the dielectric layer 34 and the thickness of the dielectric strip 33 is larger than or equal to 10 microns. When the minimum target compensation capacitance of the chip on film 30 is larger than or equal to two times the original capacitance, the dielectric constant of the dielectric layer 34 and the dielectric constant of the dielectric strip 33 may be larger than or equal to 30, and the sum of the thickness of the dielectric layer 34 and the thickness of the dielectric strip 33 is larger than or equal to 10 microns.

Figure 10:
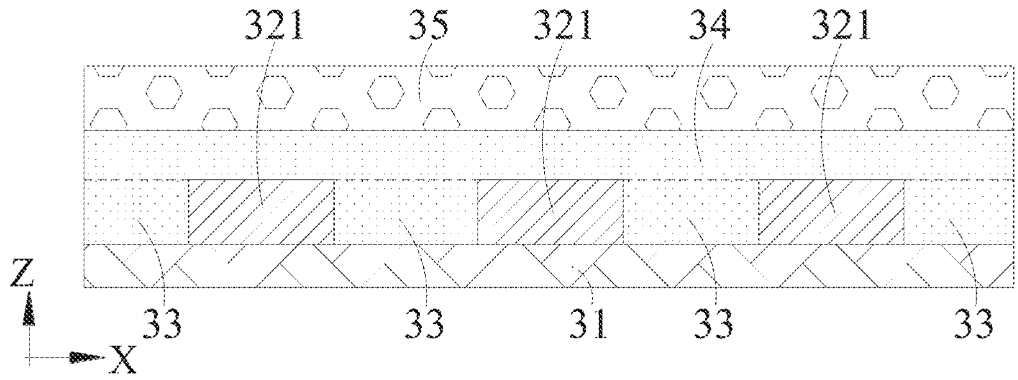
FIG. 10 is a schematic cross-sectional view after sectioning in accordance with C-C in FIG. 8.

In this example embodiment, referring to FIG. 10, where the dashed line is shown primarily to distinguish the dielectric layer 34 from the dielectric strip 33. The dielectric layer 34 and the dielectric strip 33 may be formed by the same patterning process such that the dielectric constant of the dielectric layer 34 is the same as that of the dielectric strip 33, and the dielectric layer 34 is connected to the plurality of dielectric strips 33 as an integrated body. The material of the dielectric layer 34 and the material of the dielectric strip 33 may be $TiO2$, or may be other materials with a high dielectric constant.

Of course, in some other example embodiments of the present disclosure, the dielectric layer 34 may also not cover the second left connecting wire 322*z* and the second right connecting wire 322*y* such that the outermost edge line of the orthographic projection, on the substrate layer 31, of the plurality of the dielectric strips 33 coincides with the edge line of the orthographic projection, on the substrate layer 31, of the dielectric layer 34. The dielectric layer 34 may be formed after the formation of the dielectric strips 33, and the dielectric layer 34 may also cover the longer connecting wires 321 such that the orthographic projection of the dielectric layer 34 on the substrate layer 31 covers and is larger than the orthographic projection of the plurality of dielectric strips 33 on the substrate layer 31.

In this example embodiment, the symmetry axis L does not pass through the connecting wire 321, but instead two connecting wires 321 adjacent to the symmetry axis L are provided at either side of the symmetry axis L. The two connecting wires 321 adjacent to the symmetry axis L are completely covered by the dielectric layer 34, and the length, in the second direction Y, of the dielectric strip 33 between the two connecting wires 321 adjacent to the symmetry axis L is equal to the length of the connecting wire 321 in the second direction Y, i.e., the gap 322 between the two connecting wires 321 adjacent to the symmetry axis L is filled with the dielectric strip 33. Such setting facilitates calculation and drawing during design, and facilitates simplicity in the subsequent preparation process.

Of course, in some other example embodiments of the present disclosure, the symmetry axis L may pass through one connecting wire 321, then the connecting wire 321 that is passed through by the symmetry axis L may be completely covered by the dielectric layer 34, and the lengths, in the second direction Y, of two dielectric strips 33 adjacent to the symmetry axis L are equal to the length of the connecting wire 321 in the second direction Y.

After a number of tests, the experimental conditions are as follows: the length of two connecting wires 321 are 100 microns, the width of the connecting wire 321 is about 13 microns, the width of the gap 322 between two adjacent connecting wires 321 is about 12 microns; in the absence of the dielectric strip 33 and the dielectric layer 34 (i.e., with only the substrate layer 31 and the protective layer 35), the capacitance between the two connecting wires 321 is about 11.6 fF; in the case where the dielectric strip 33 and the dielectric layer 34 are provided, the capacitance between the two connecting wires 321 is about 66.2 fF. The capacitance between two connecting wires 321 increases to about six times the original capacitance after the dielectric strip 33 and the dielectric layer 34 are provided, and thus the compensation capacitance can be increased to the order of pF, and the capacitance compensation of the data line 153 can be achieved.

The protective layer 35 is provided at the side of the dielectric layer 34 away from the substrate layer 31, and the specific structure of the protective layer 35 has been described in detail above, and thus will not be repeated herein.

Based on the same inventive concept, the example embodiments of the present disclosure provide a display device. The display device may include a display panel, a chip on film 30, and a circuit board. The display panel may include a plurality of data lines 153. The chip on film 30 is the chip on film 30 described in any of the foregoing and is connected between the display panel and the circuit board. The connecting wires 321 are connected to the data lines 153. The specific structure of the chip on film 30 has been described in detail above and therefore will not be repeated herein.

The specific structure of the display panel and the connection relationship between the display panel and the chip on film 30 have also been described in detail above, and therefore will not be repeated herein.

The specific type of the display device is not particularly limited, and the types of display devices commonly used in the field are available. Specifically, the display device, for example, may be mobile devices such as mobile phones, wearable devices such as watches, and VR devices, and those skilled in the art may choose accordingly to the specific use of the display device, which will not be repeat herein.

It should be illustrated that the display device may also include other necessary parts and compositions, taking a computer display device as an example, specifically for example, a housing, a circuit board, a power cord, and so on, which may be supplemented accordingly by those skilled in the art according to the specific usage requirements of the display device, and which will not be repeated herein.

Compared with the prior art, the beneficial effects of the display device provided in the example embodiments of the present disclosure are the same as the beneficial effects of the chip on film 30 provided in the above example embodiments, and will not be repeated herein.

After considering the specification and practicing the present disclosure herein, those skilled in the art will easily come up with other embodiments of the present disclosure. The purpose of the present disclosure is to cover any variations, uses, or adaptations of the present disclosure, and these variations, uses, or adaptations follow the general principles of the present disclosure and include common knowledge or commonly used technical means in the technical field that are not disclosed in the present disclosure. The specification and embodiments are only considered exemplary, and the true scope and spirit of the present disclosure are indicated by the accompanying claims.

What is claimed is:

1. A chip on film, comprising:
- a substrate layer;
- a conductor layer, arranged at a side of the substrate layer, wherein the conductor layer comprises a plurality of connecting wires arranged along a first direction, and a gap is provided between two adjacent ones of the connecting wires;
- a plurality of dielectric strips, wherein the dielectric strip is provided in at least part of gaps, a length of the dielectric strip in a second direction is less than or equal to a length of the gap in the second direction, and the second direction intersects with the first direction; and
- a protective layer, arranged at a side of the conductor layer and the dielectric strip away from the substrate layer, wherein the dielectric strip has a larger dielectric constant than the protective layer; wherein
- the dielectric strip has a same height in a third direction as the connecting wire, the third direction is perpendicular to a surface of the substrate layer close to the conductor layer, and the chip on film further comprises:
- a dielectric layer, arranged between the conductor layer and the protective layer, wherein an orthographic projection of the protective layer on the substrate layer covers and is larger than an orthographic projection of the dielectric layer on the substrate layer, the orthographic projection of the dielectric layer on the substrate layer covers an orthographic projection of the dielectric strip on the substrate layer, and the dielectric layer has a larger dielectric constant than the protective layer.

2. The chip on film according to claim 1, wherein the plurality of the connecting wires are arranged symmetrically relative to a symmetry axis, the plurality of the dielectric strips are arranged symmetrically relative to the symmetry axis, and the symmetry axis is a central axis, extending along the second direction, of the substrate layer.

3. The chip on film according to claim 2, wherein lengths of the plurality of the dielectric strips in the second direction decrease as distances between the dielectric strips and the symmetry axis increases.

4. The chip on film according to claim 1, wherein the plurality of the dielectric strips are provided with flush ends.

5. The chip on film according to claim 1, wherein the dielectric layer has the same dielectric constant as the dielectric strip, and the dielectric layer and the plurality of the dielectric strips are connected as an integrated body.

6. The chip on film according to claim 5, wherein an outermost edge line of an orthographic projection, on the substrate layer, of the plurality of the dielectric strips coincides with an edge line of the orthographic projection, on the substrate layer, of the dielectric layer.

7. The chip on film according to claim 1, further comprising:
- an integrated circuit, arranged at a side of the protective layer away from the substrate layer and electrically connected to the conductor layer;
- a first binding pin, arranged at a side of the integrated circuit, and used for connecting to an output signal end; and
- a second binding pin, arranged at a side of the integrated circuit away from the first binding pin, and used for connecting to an input signal end.

8. The chip on film according to claim 7, wherein the dielectric strip and the dielectric layer are arranged at a side of the integrated circuit close to the first binding pin.

9. The chip on film according to claim 8, wherein the plurality of the connecting wires are arranged symmetrically relative to a symmetry axis, the dielectric layer is arranged symmetrically relative to the symmetry axis, the plurality of the dielectric strips are arranged symmetrically relative to the symmetry axis, and the symmetry axis is a central axis, extending along the second direction, of the integrated circuit.

10. The chip on film according to claim 9, wherein a length of the dielectric layer in the second direction decreases as a distance between the dielectric layer and the symmetry axis increases.

11. The chip on film according to claim 10, wherein ends of the plurality of the dielectric strips close to the integrated circuit are flush, a side surface of the dielectric layer close to the integrated circuit is coplanar with an end surface of the plurality of the dielectric strips close to the integrated circuit, and a side surface of the dielectric layer away from the integrated circuit intersects with the first direction.

12. The chip on film according to claim 9, wherein the dielectric layer does not cover the connecting wire that is located outermost, and no dielectric strip is provided in the gap between the connecting wire that is located outermost and the connecting wire adjacent to the connecting wire that is located outermost.

13. The chip on film according to claim 9, wherein two of the connecting wires adjacent to the symmetry axis are completely covered by the dielectric layer, and the length, in the second direction, of the dielectric strip between the two connecting wires adjacent to the symmetry axis is equal to a length, in the second direction, of the connecting wire adjacent to the symmetry axis; or
- the connecting wire that is passed through by the symmetry axis is completely covered by the dielectric layer, and lengths, in the second direction, of two of the dielectric strips adjacent to the symmetry axis are equal to the length, in the second direction, of the connecting wire that is passed through by the symmetry axis.

14. The chip on film according to claim 1, wherein the dielectric constant of the dielectric layer and the dielectric constant of the dielectric strip increase as a minimum target compensation capacitance of the chip on film increases; or
- a length of the dielectric layer in the second direction and the length of the dielectric strip in the second direction increase as the minimum target compensation capacitance of the chip on film increases.

15. The chip on film according to claim 14, wherein the minimum target compensation capacitance of the chip on film is larger than or equal to five times an original capacitance, the dielectric constant of the dielectric layer and the dielectric constant of the dielectric strip are larger than or equal to 60, and a sum of a thickness of the dielectric layer and a thickness of the dielectric strip is larger than or equal to 10 microns; or the minimum target compensation capacitance of the chip on film is larger than or equal to two times the original capacitance, the dielectric constant of the dielectric layer and the dielectric constant of the dielectric strip are larger than or equal to 30, and the sum of the thickness of the dielectric layer and the thickness of the dielectric strip is larger than or equal to 10 microns.

16. The chip on film according to claim 1, wherein a material of the dielectric strip and a material of the dielectric layer comprise TiO2.

17. A display device, comprising:

a display panel, comprising a plurality of data lines;

a circuit board; and a chip on film, wherein the chip on film comprises:

a substrate layer;

a conductor layer, arranged at a side of the substrate layer, wherein the conductor layer comprises a plurality of connecting wires arranged along a first direction, and a gap is provided between two adjacent ones of the connecting wires;

a plurality of dielectric strips, wherein the dielectric strip is provided in at least part of gaps, a length of the dielectric strip in a second direction is less than or equal to a length of the gap in the second direction, and the second direction intersects with the first direction; and a protective layer, arranged at a side of the conductor layer and the dielectric strip away from the substrate layer, wherein the dielectric strip has a larger dielectric constant than the protective layer; wherein the chip on film is connected between the display panel and the circuit board, and the connecting wire is connected to the data line; and the dielectric strip has a same height in a third direction as the connecting wire, the third direction is perpendicular to a surface of the substrate layer close to the conductor layer, and the chip on film further comprises:

a dielectric layer, arranged between the conductor layer and the protective layer, wherein an orthographic projection of the protective layer on the substrate layer covers and is larger than an orthographic projection of the dielectric layer on the substrate layer, the orthographic projection of the dielectric layer on the substrate layer covers an orthographic projection of the dielectric strip on the substrate layer, and the dielectric layer has a larger dielectric constant than the protective layer.

18. The display device according to claim 17, wherein lengths of the plurality of the dielectric strips in the second direction increase as lengths of the data lines decrease, and the data line is connected to the connecting wire located at a same side as the dielectric strip.

19. The display device according to claim 17, wherein a length of the dielectric layer in the second direction increases as a length of the data line connected to the connecting wire covered by the dielectric layer decreases.

* * * * *